United States Patent [19]

Kozuch

[11] Patent Number: 4,584,650

[45] Date of Patent: Apr. 22, 1986

[54] METHOD AND APPARATUS FOR DETERMINING AND DIRECTLY MEASURING THE VOLTAGE STANDING WAVE RATIO OF AN RF TRANSMISSION SYSTEM

[75] Inventor: Marcel Kozuch, Paramus, N.J.

[73] Assignee: H. F. Henderson Industries, West Caldwell, N.J.

[21] Appl. No.: 549,402

[22] Filed: Nov. 7, 1983

[51] Int. Cl.$^4$ .................... G01R 27/06; G06J 1/00
[52] U.S. Cl. .............. 364/481; 324/57 R; 324/58 R; 364/482; 455/115
[58] Field of Search ............ 364/481, 482, 483, 606; 324/57 R, 58 R; 455/115

[56] References Cited

U.S. PATENT DOCUMENTS

| | | | |
|---|---|---|---|
| 3,243,704 | 3/1966 | Jarger et al. ................. | 324/95 |
| 3,428,790 | 2/1969 | Aitchison .................... | 364/606 |
| 3,683,274 | 8/1972 | Martin ......................... | 324/58 R |
| 3,704,409 | 11/1972 | Oomen ........................ | 324/57 R |
| 4,041,395 | 8/1977 | Hill .............................. | 364/482 X |
| 4,110,685 | 8/1978 | Leenerts ...................... | 324/57 R X |
| 4,125,896 | 11/1978 | Metcalf ........................ | 364/606 |
| 4,249,127 | 2/1981 | Morgan ....................... | 324/57 R |
| 4,250,558 | 2/1981 | Keyes et al. ................. | 364/606 X |
| 4,262,246 | 4/1981 | Fujii ............................ | 324/58 R |
| 4,263,653 | 4/1981 | Mecklenburg ................ | 364/483 |
| 4,270,177 | 5/1981 | Endoh et al. ................. | 364/606 X |

Primary Examiner—Felix D. Gruber
Attorney, Agent, or Firm—Leitner & Martin

[57] ABSTRACT

A system for determining the magnitude or value of the VSWR of an RF transmission system is disclosed. A VSWR value is preselected, and the ratio of reflected voltage to forward voltage for the system for a preselected VSWR is determined. The ratio is multiplied by the absolute value of the measured instantaneous forward RF voltage, giving a predicted value for the actual reflected voltage. The reflected voltage is measured, and the predicted and actual values are compared. The actual VSWR bears the same relationship to the predetermined VSWR that the actual reflected voltage bears to the predicted reflected voltage. To determine the actual value of the VSWR, a counter which contains the preselected VSWR value is incremented or decremented as a result of the comparison until the difference changes sign. The predetermined VSWR employed for the final comparison, which value is still stored in the counter, is sent to the display circuit, as the actual VSWR. Various apparatus means, such as a microprocessor, digital-to-analog multiplying converter, and analog sensors are also disclosed.

8 Claims, 4 Drawing Figures

METHOD AND APPARATUS FOR DETERMINING AND DIRECTLY MEASURING THE VOLTAGE STANDING WAVE RATIO OF AN RF TRANSMISSION SYSTEM

FIELD OF THE INVENTION

This invention relates to a system for determining the voltage standing wave ratio (VSWR) for an RF transmission system, and more particularly, to a system which allows measurement of the VSWR on a "larger than" or "smaller than" basis, as compared to a predetermined value, as well as allowing for direct VSWR measurement.

DESCRIPTION OF THE PRIOR ART

The condition of an RF transmission system is indicated by the VSWR as determined by the impedance match between an antenna and a transmission line. As the transmitter power in an RF transmission system is varied, the magnitudes of the forward voltage and reflected voltage also vary. It is therefore desirable to have a system whereby the standing wave ratio of an RF transmission may be monitored, without constant correction for variation. Although a number of systems have been proposed to provide such a monitor, these systems frequently suffer from the need to calculate VSWR on the basis of measured variable inputs, depending on sensors which require constant recalibration. Another common disadvantage of prior art systems is the difficulties introduced in precisely calculating the VSWR at any given time. Frequently, in operation, all that need be determined is the relative position of the VSWR against a known value, not an accurate determination of the actual value. Therefore, if a system providing ease of calibration and insensitivity to variation could be established for determining the relative value of the VSWR of an RF transmission system could be established, monitoring and correction of such transmission systems would be considerably facilitated over prior art practices.

Accordingly, it is one object of this invention to provide a system whereby the relative value of the VSWR of an RF transmission system may be determined.

It is another object of this invention to provide a system for determining VSWR which is insensitive to voltage variation and may be easily calibrated.

It is yet a further object of this invention to provide a system whereby the VSWR of a transmission system may be directly measured.

These and other objects of the invention will be apparent from the detailed description below.

SUMMARY OF THE INVENTION

The VSWR value is determined by selecting a predicted or predetermined VSWR and looking up the ratio of the absolute value of the reflected voltage to the absolute value of forward voltage for the predetermined VSWR. This ratio is then multiplied by the sensed instantaneous forward voltage of the system, the product of that multiplication being compared to the measured instantaneous reflected voltage. Depending on whether the measured reflected voltage is either greater or smaller than the multiplication product of the ratio times the forward voltage, the actual value of the VSWR is greater or less than the predicted value of the VSWR, respectively.

To make direct measurement of the VSWR of the transmission system, the results of the above comparisons are fed to a counter. Based on the result of the comparison, the counter is either incremented or decremented and a new predetermined value VSWR is fed to the look-up table containing values of the calculated ratio versus predicted VSWR. The predetermined VSWR is therefore either increased or decreased, and the operation repeated. This repetition is continued until the difference of the measured reflected voltage less the ratio multiplied by the forward voltage is of a sign different than the initial difference. The predetermined VSWR used in the current repetition is the actual VSWR, which may now be displayed.

DETAILED DESCRIPTION OF THE INVENTION

The voltage standing wave ratio of an RF transmission may be defined by the following equation:

$$VSWR = \frac{E_f + E_r}{E_f - E_r} = \frac{1 + r}{1 - r}$$

where $E_f$ = absolute value of instantaneous forward rf voltage
$E_r$ = absolute value of instantaneous reflected rf voltage
r = ratio of $E_r/E_f$
Therefore, $r = (S-1)/(S+1)$ wherein S = VSWR.

From the above equations, it may be seen that, for any given VSWR value of an RF transmission system, each such value will have a single value r, which may be calculated for a range of VSWRs. A table of ratio r versus VSWR for the operating range of any RF transmission system may thereby be generated. This lookup table is stored in a permanent read-only memory. It is apparent that, for any given VSWR, there will be a specific reciprocal for ratio r as well. Tables of reciprocal r versus VSWR may also be generated and stored in the PROM.

Based on the above defining equations, it is apparent that, given a predicted value $r_p$ of ratio r, and an actual measured value $E_{fa}$ of $E_f$, there exists a predicted value $E_{rp}$ of $E_r$ corresponding to $E_{fa}$, such that the following equation is valid:

$$E_{rp} = r_p E_{fa}$$

If the actual value $E_{ra}$ of $E_r$ is equal to the predicted value $E_{rp}$, then the predicted value $r_p$ is equal to the actual value of $r_a$ in this measurement. Accordingly, the actual value of the $VSWR_a$ equals the predetermined value $VSWR_{pd}$. Alternatively $E_{ra}$ must be either larger than, or smaller than, $E_{rp}$, indicating that the actual value of $VSWR_a$ is larger than, or smaller than, respectively, the predetermined value of $VSWR_{pd}$.

Figure 1:
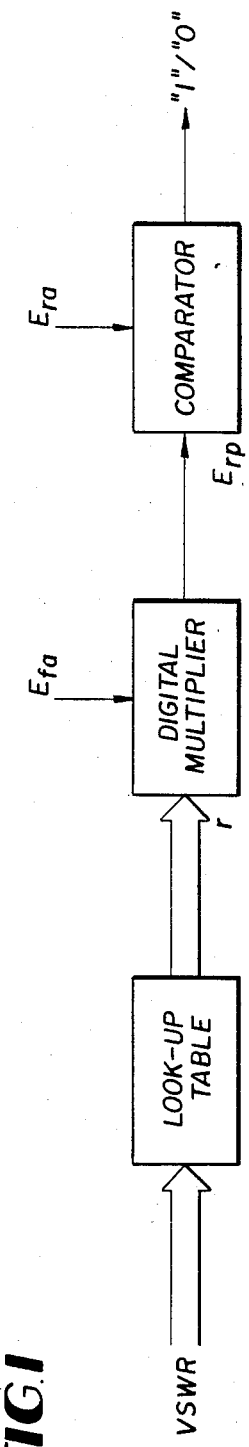
FIG. 1 is a block flow chart diagram illustrating the basic inputs and calculations necessary to the invention.

The instant system for determining and/or directly measuring VSWR is based on implementing the above derived relationships. This implementation is broadly illustrated in FIG. 1. The predetermined $VSWR_{pd}$ addresses a look-up table which contains a complete set of values $r_p$ over the VSWR operating range of the RF transmission system. The $VSWR_{pd}$ may be selected either as an extreme limit for the transmission system, to determine if the system is actually operating outside those limits, or as an expected value, to determine if the transmission system is operating as anticipated. The output from the look-up table, the ratio of the absolute value of the reflected voltage to the absolute value of the forward voltage, $r_p$, is provided from the look-up table to the digital multiplier of FIG. 1. As noted, this output could as easily be the reciprocal of $r_p$.

The sensed actual forward voltage is also inputted to the digital multiplier. The multiplier output, $r_p$ times $E_{fa}$, is the predicted reflected voltage value $E_{rp}$, which is then compared, in the comparator, with the actual measured reflected voltage $E_{ra}$. The comparator determines whether $E_{ra}$ is larger or smaller than $E_{rp}$, a decision marked by a "1" level or a "0" level output, respectively. On the basis of that output, the relative value of the actual $VSWR_a$, as compared with the predetermined $VSWR_{pd}$, is known. Particularly where the predetermined $VSWR_{pd}$ is a value at the limit of the operating range of the RF transmission system or desired operating range, this information may be satifactory, and the process is then repeated periodically, to determine continued performance by the transmission system.

Figure 2:
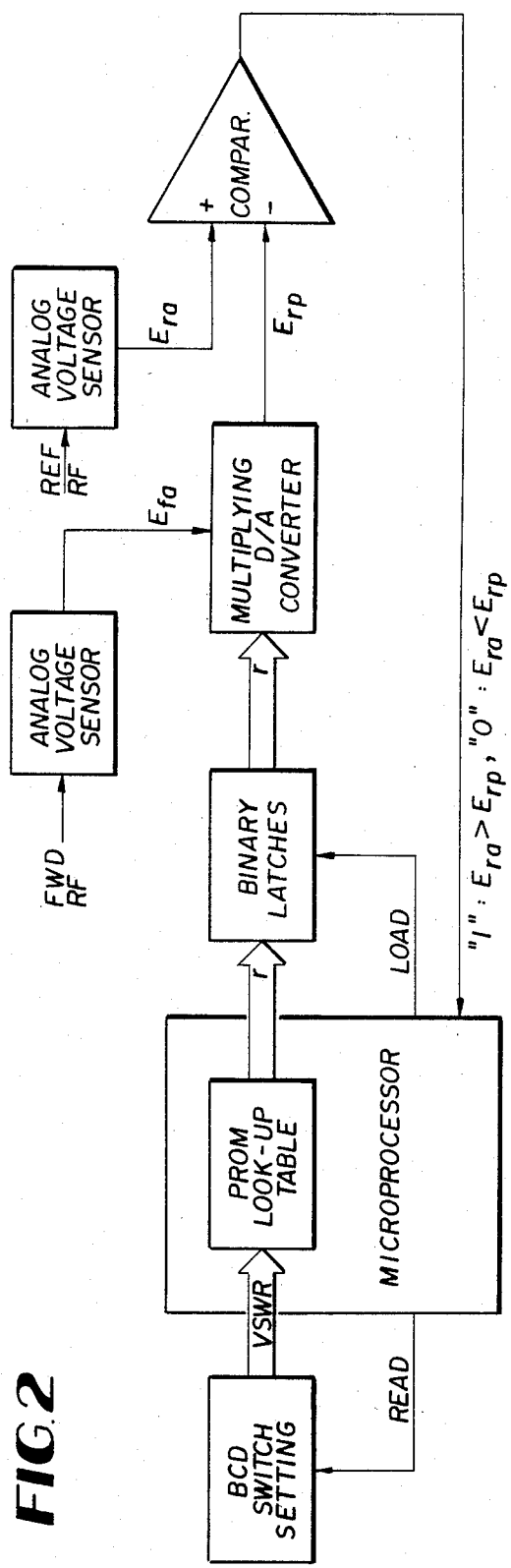
FIG. 2 is a block flow chart diagram illustrating the details of the system of this invention, whereby the relative value of the VSWR may be determined.

FIG. 2 illustrates, in detail, the apparatus employed in carrying out this system. A set of switches holds the predetermined $VSWR_{pd}$ value in binary coded decimal (BCD) format. The $VSWR_{pd}$ value addresses the PROM look-up table, which is the permanent memory part of the microprocessor device of the apparatus of this system. The PROM table output value of $r_p$ is presented in binary format with as many bits as required by the resolution of the measurement and by the magnitude of the corresponding $VSWR_{pd}$ number.

The microprocessor controls the reading of the BCD switches, the addressing of the look-up table, and the loading of the ratio $r_p$ value into the binary latches. The ratio $r_p$ is stored into the binary latches so that the microprocessor can release itself from this measurement.

The latches feed the binary input (r) to the digital-to-analog converter. The digital-to-analog converter receives at the reference input the absolute value of the actual forward voltage $E_{fa}$ in analog form. This value is the output of an analog sensor which detects the envelope voltage of the forward RF signal. The digital-to-analog converter multiplies the two inputs, its output therefore being the absolute value of the predicted reflected voltage $E_{rp}$.

This output is sent to the comparator, where it is compared with the absolute value of the actual reflected voltage $E_{ra}$, which is, again, the output of an analog sensor which detects the envelope voltage of the reflected RF signal.

The comparator constantly compares the two inputs and presents the comparison result to the microprocessor. The microprocessor need only look at the comparator output on a periodic basis, and thereupon determines the outcome of the measurement; failure indication, next measurement preparation, etc. The time-to look by the microprocessor is programmed so that it allows for settling time at the analog voltage channels where $E_{fa}$ and $E_{ra}$ originate.

As noted, in place of the ratio value $r_p$ for the predetermined $VSWR_{pd}$, the reciprocal of $r_p$ could be stored in a look-up table. In this system, the absolute value of the actual reflected voltage $E_{ra}$ would be inputted to the digital-to-analog converter, and the absolute value of the actual forward RF voltage $E_{fa}$ would be the basis for the comparison made by comparator. In such a system, the actual VSWR will vary inversely with the difference between the actual and predicted forward voltage. However, although the results of the reciprocal system are equal, and it is recognized as an art equivalent, it introduces several difficulties. In particular for a matched system, the reciprocal numbers tend to be quite large, requiring mathematical computations which are subject to error.

The above-described system is particularly valuable in determining if actual $VSWR_a$ falls between two sets of predetermined limits, frequently the limits of the operating range of the RF transmission system, as noted above. In such a system, there are two BCD switch settings: an upper and a lower VSWR limit. The microprocessor alternates the predetermined $VSWR_{pd}$ and corresponding $r_p$ value between the two limits, and the comparator output is processed accordingly. As is apparent, the VSWR determination provided by this system is insensitive to analog voltage drift in $E_{fa}$ and $E_{ra}$, provided the variations due to drift track each other.

Figure 3:
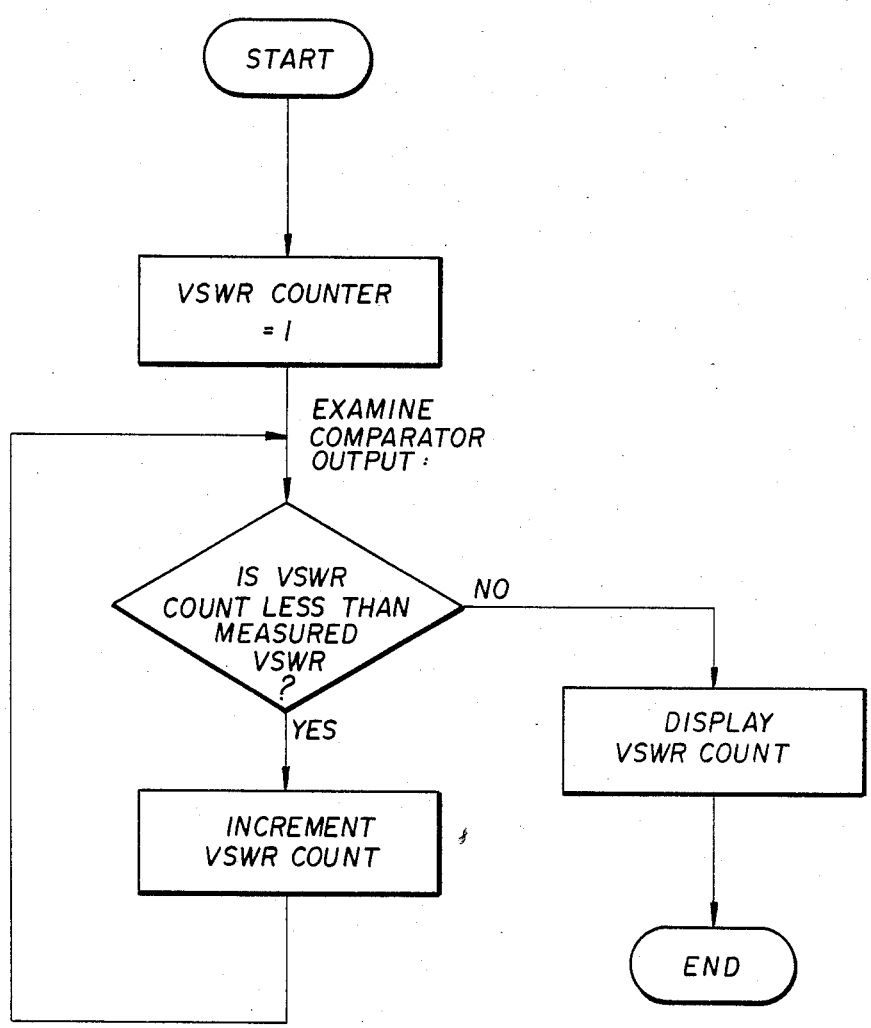
FIG. 3 is a flow chart illustrating the embodiment of the system whereby the VSWR may be directly measured.
Figure 4:
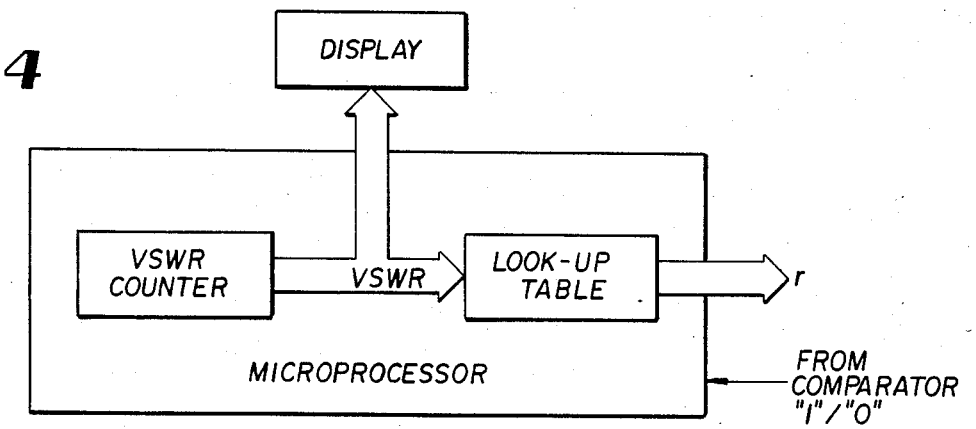
FIG. 4 is a partial block flow chart diagram adapted from FIG. 2 and illustrating the details of the system used with the flow chart of FIG. 3 to directly measure the VSWR.

Although, as noted, the above-described system has its own utility, particularly in determining whether a transmission system is operating within desired limits, it may frequently be desirable to directly measure the VSWR of the system at any particular time. An embodiment of this invention suitable for so directly measuring VSWR is illustrated in FIGS. 3 and 4.

A synchronous counter, whose count represents VSWR, counts up starting at the minimum value one. Alternatively, the counter may count down starting from a maximum value or have a predetermined value set therein. The counter feeds the look-up table that contains values of the ratio r versus VSWR. For each counter value, a $VSWR_{pd}$ is selected, the ratio r inputted as above, and the above-described comparison between predicted and actual voltages is made. The comparator output is examined and a decision is made on whether or not to increment the counter. When the comparator indicates the value for the predicted reflected voltage $E_{rp}$ has just exceeded the actual reflected voltage value $E_{ra}$, the VSWR counter value has reached the actual VSWR value, and the counter incrementing stops. The display circuit is now loaded with the final VSWR value from the counter, which corresponds to the actual $VSWR_a$ value.

As is apparent to those of skill in the art, in terms of the mathematical relationship set forth above, the comparator, on the initial comparison, subtracts from the predicted reflected or forward voltage the actual voltage. If the predetermined $VSWR_{pd}$ is the actual VSWR, the difference is zero, the counter is stopped, and the predetermined VSWR displayed. If the difference is positive or negative, the incrementing up or down continues until the difference is of a sign opposite that of the initial comparison. The predetermined $VSWR_{pd}$ employed in making the last comparison then corresponds to the actual VSWR, which is then displayed.

The instant invention has been described above with respect to particular embodiments and devices. Variations will occur to those of ordinary skill in the art, particularly with respect to the relationship between the input and output values, and the hardware employed in driving and performing operations on the inputted data, without the exercise of inventive faculty. Such variations remain within the scope of the instant invention.

What is claimed is:

1. A method for determining the relative magnitude of the VSWR of an RF transmission system comprising:
   predetermining a VSWR;
   determining from stored data the ratio of the absolute value of the reflected RF voltage to the absolute value of the forward RF voltage corresponding to said predetermined VSWR;
   measuring the actual value of the instantaneous forward RF voltage of said transmission system;
   multiplying said ratio by the absolute value of said actual measured forward RF voltage system to derive a product corresponding to a predicted reflected RF voltage of said transmission system;
   measuring the actual value of the instantaneous reflected RF voltage of said transmission system; and
   comparing the predicted reflected RF voltage with the absolute value of said measured actual instantaneous reflected RF voltage; and
   indicating the results of said comparison as a determination of the relative magnitude of the VSWR to the predetermined VSWR.

2. A method for directly measuring the VSWR of an RF transmission system, comprising the following steps:
   (1) deriving from stored data the ratio of the absolute value of the instantaneous reflected RF voltage to the absolute value of the instantaneous forward RF voltage for a predetermined VSWR;
   (2) measuring the actual value of the instantaneous forward RF voltage of said transmission system;
   (3) multiplying said ratio by the absolute value of said measured actual value of forward RF voltage to derive a product corresponding to the predicted value of reflected RF voltage of the transmission system;
   (4) measuring the actual value of the instantaneous reflected RF voltage of said transmission system;
   (5) subtracting said predicted value of reflected RF voltage from the absolute value of said measured actual value of reflected RF voltage; and, if the difference of said substraction is other than zero, repeating said steps 1-5, on each repetition increasing said predetermined VSWR by an incremental amount if the product of said first subtraction has a positive value, or decreasing said predetermined VSWR by incremental amounts if said difference is a negative value; and continuing said repetition n times, where, on the nth repetition the difference of said nth subtraction is a value whose sign is opposite that of the difference of said first subtraction; and
   (6) displaying the predetermined VSWR of the nth repetition as of the actual VSWR.

3. An apparatus for determining the magnitude of the VSWR of an RF transmission system, comprising:
   means for providing a preselected VSWR;
   means including stored data means for providing an output indicative of the ratio of the absolute value of the reflected RF voltage to the absolute value of the forward RF voltage corresponding to said preselected VSWR;
   means for measuring the actual value of the instantaneous forward RF voltage of said transmission system;
   means for multiplying said ratio by the absolute value of said measured forward RF voltage to derive a product corresponding to a predicted reflected RF voltage;
   means for measuring the actual value of the instantaneous actual reflected RF voltage of said transmission system; and
   means for comparing said predicted reflected RF voltage with the absolute value of said measured instantaneous actual reflected RF voltage; and
   means for displaying the output of said comparing means.

4. The apparatus of claim 3, wherein said stored data means is comprised of a PROM look-up table.

5. A radio frequency system wherein power is transferred from a source to a load comprising:
   means for establishing a preselected VSWR;
   means for deriving from stored data an output indicative of a ratio r of the absolute value of the reflected voltage to the absolute value of the forward voltage corresponding to said preselected VSWR;
   means for deriving the actual reflected voltage $E_{ra}$;
   means for deriving the actual forward voltage $E_{fa}$;
   a digital multiplier having a first input for the ratio r and a second input for the voltage $E_{fa}$ and producing an output representing a predicted reverse voltage $E_{rp}$;
   a comparator having a first input for the voltage $E_{rp}$ and a second input for the actual reverse voltage $E_{ra}$, said comparator producing a "1" or a "0" output when the voltage $E_{ra}$ is respectively greater than or less than $E_{rp}$, said "1" or "0" output corresponding to an actual VSWR greater than or less than the preselected VSWR.

6. A radio frequency system as set forth in claim 5 further comprising:
   means for varying the preselected VSWR in response to said comparator output.

7. A radio frequency system as set forth in claim 6 wherein said means for varying the preselected VSWR includes:
   a counter producing a count representative of the preselected VSWR, and means responsive to the comparator for incrementing or decrementing the counter in response to a corresponding difference between the actual and preselected VSWR.

8. A radio frequency system as set forth in claim 7 wherein said means comprises a digital microprocessor.

* * * * *